United States Patent [19]

Yamamoto et al.

[11] 4,315,273

[45] Feb. 9, 1982

[54] COMPOUND SEMICONDUCTOR HALL EFFECT ELEMENT

[75] Inventors: Kaneo Yamamoto; Hiroshi Nakamura; Toshio Konno, all of Yokohama, Japan

[73] Assignee: Victor Company of Japan, Limited, Yokohama, Japan

[21] Appl. No.: 91,937

[22] Filed: Nov. 7, 1979

[30] Foreign Application Priority Data

Nov. 24, 1978 [JP] Japan .................................. 53-145156

[51] Int. Cl.³ .......................................... H01L 27/22
[52] U.S. Cl. ..................................... 357/27; 357/55; 357/60
[58] Field of Search .............................. 357/27, 60, 55

[56] References Cited

U.S. PATENT DOCUMENTS 4,025,941 5/1977 Kanda .................................. 357/27

Primary Examiner—Martin H. Edlow
Attorney, Agent, or Firm—Lowe, King, Price & Becker

[57] ABSTRACT

A hall effect element of the type having a semi-insulating substrate of a single crystal of a compound semiconductor such as GaAs and an either n-type or p-type conducting layer which is formed on a surface given by a (1 0 0) plane of the single crystal and selectively removed by etching together with a surface region of the substrate to provide a Hall-pattern. As the improvement, the direction of current inflow in the Hall-pattern is made to coincide with either the [1 $\bar{1}$ 0] direction or the [1 1 0] direction in the (1 0 0) plane, whereby the Hall element becomes very small in the magnitude of unbalanced voltage despite a relatively high Hall voltage.

4 Claims, 6 Drawing Figures

COMPOUND SEMICONDUCTOR HALL EFFECT ELEMENT

BACKGROUND OF THE INVENTION

This invention relates to a Hall effect element of the type utilizing the Hall effect in a single crystal of a compound semiconductor.

A semiconductor Hall effect element is obtained by forming a cross-shaped Hall-pattern on the surface of a wafer which consists fundamentally of a substrate made of a single crystal of a compound semiconductor, such as GaAs, InSb or InAs, and a conducting layer formed on a major surface of the substrate. The Hall-pattern is formed by an etching technique. Conventional Hall effect elements of this type have a drawback that in general they exhibit a large magnitude of unbalanced voltage. Besides, in the industrial production of such Hall effect elements there appears considerable variations of the magnitude of unbalanced voltage among the produced Hall effect elements.

SUMMARY OF THE INVENTION

It is an object of the present invention to provide a Hall effect element of the type utilizing a single crystal of a compound semiconductor, which Hall effect element exhibits a relatively large magnitude of Hall voltage and, nevertheless, is very small in the magnitude of unbalanced voltage.

It is another object of the invention to provide a Hall effect element of the aforesaid type, which can be mass-produced with good uniformity in the performance of the products.

We have found that the origin of the above described drawback of the conventional Hall effect elements is that the Hall-pattern is formed by etching without paying any particular attention to the orientation of the Hall-pattern so that there is no specific relation between the direction of current inflow in the Hall-pattern and crystallographic directions in a crystal plane which gives the aforementioned major surface of the semiconductor single crystal, and, moreover, we have discovered that the unbalanced voltage of the Hall effect element can be minimized by forming the Hall-pattern in such an orientation that the direction of current inflow in the Hall-pattern coincides with a specific crystallographic direction in the utilized crystal plane of the semiconductor single crystal.

A Hall effect element according to the invention comprises a substrate which is made of a single crystal of a compound semiconductor, which is made semi-insulating, and has a major surface given by a (1 0 0) crystal plane of the single crystal and a conducting layer which is formed on the major surface of the substrate and selectively etched together with a surface region of the substrate so as to provide a Hall-pattern having a pair of end terminals which serve as input terminals and another pair of end terminals which serve as output terminals. The improvement according to the invention resides in that the Hall-pattern is formed in such an orientation that the direction of current inflow in the Hall-pattern through the input terminals substantially coincides with the crystallographic [1 $\bar{1}$ 0] direction or the [1 1 0] direction of said single crystal in said (1 0 0) plane.

DESCRIPTION OF THE PREFERRED EMBODIMENTS

Prior to a detailed description of the present invention, a brief description of a conventional semiconductor Hall effect element will be given with reference to FIGS. 1-4 of the accompanying drawing to facilitate a clear recognition of the aforementioned drawback of the prior art and our discovery which has lead to the present invention.

Figure 1:
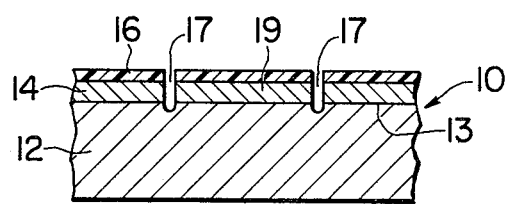
FIG. 1 shows, explanatorily and in section, a semiconductor wafer subjected to selective etching during fabrication of a Hall effect element.

A conventional GaAs Hall effect element is taken as a typical example, and FIG. 1 shows a wafer 10 as a fundamental material for this Hall effect element. This wafer 10 has a semi-insulating substrate 12 which is made of a single crystal of GaAs doped with chromium and oxygen, and a conducting layer 14 of Sn-doped GaAs is formed on a major surface 13 of the substrate 12 by epitaxial growth. As the first step of producing the Hall effect element, a protective film 16 is formed on the outer surface of the conducting layer 12 by the application of a photoresist. Then a predetermined etching pattern is provided in the photoresist film 16 by the usual procedure of selective exposure to ultraviolet rays (using a patterned mask) and subsequent development, whereby the photoresist film 16 is selectively removed. The thus treated wafer 10 is subjected to an etching process such that the entire thickness of the conducting layer 14 is removed together with a surface region of the semi-insulating substrate 12 (as indicated by slots 17) in accordance with the etching pattern, while the remaining portion of the photoresist film 16 protects the remaining areas of the wafer 10 against etching. This etching process provides a Hall-pattern (indicated at 19) of a predetermined shape on the surface of the wafer 10.

Usually the single crystal substrate 12 is prepared such that a (1 0 0) plane of the single crystal gives the major surface 13 of the substrate 12. Accordingly, the outer surface of the conducting GaAs layer 14, too, becomes (1 0 0) plane. We have confirmed that the rate of etching in a crystallographic direction in the (1 0 0) plane of GaAs, as an example of useful compound semiconductors, differs from the etching rate in other crystallographic directions in the same plane and that the etching rate in this plane becomes maximal in the [1 $\bar{1}$ 0] direction and differently lowers in other directions such that [1 $\bar{1}$ 0]>[1 0 0]>[1 1 0].

Figure 2:
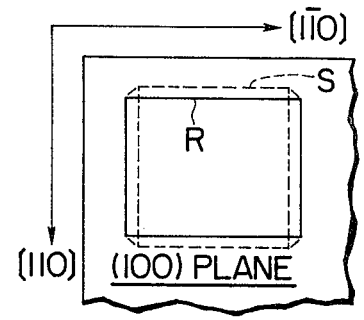
FIG. 2 illustrates explanatorily a phenomenon that occurs during etching of the wafer of FIG. 1.

Referring to FIG. 2, when selective etching is performed on the GaAs wafer 10 of FIG. 1 by the employment of a square-shaped etching pattern S (shown in dotted line) with its sides extending in the [1 $\bar{1}$ 0] and [1

1 0] directions, i.e. by removing the photoresist film 16 in the square area, the result is the formation of a rectangular pattern R (shown in solid line) which is elongated in the [1 $\bar{1}$ 0] direction.

Figure 3:
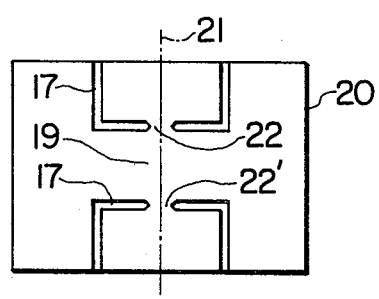
FIG. 3 is a schematic plan view of a conventional Hall effect element obtained by the use of the wafer of FIG. 1.

FIG. 3 is a schematic plane view of a conventional Hall effect element 20 obtained through the process described with reference to FIG. 1 without considering the arrangement of the etching pattern or the resultant Hall-effect pattern 19 relative to crystallographic directions in the aforementioned (1 0 0) plane. By reason of the phenomenon explained with reference to FIG. 2, the Hall-effect pattern 19 exhibits asymmetry with respect to a lateral axis 21 in each of a pair of output terminal regions 22, 22'.

Figure 4:
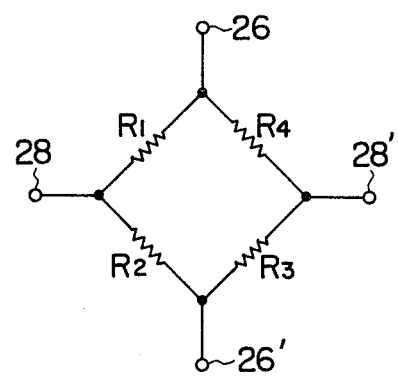
FIG. 4 shows an equivalent circuit of a Hall effect element having a Hall-pattern as shown in FIG. 3.

The equivalent circuit of a Hall effect element having a cross-shaped Hall-pattern is a bridge circuit as shown in FIG. 4, wherein numerals 26, 26' indicate input terminals and 28, 28' output terminals. In this circuit, unbalanced voltage $V_o$ becomes zero when the four resistances $R_1$, $R_2$, $R_3$, $R_4$ are determined such that $R_1 \cdot R_3 = R_2 \cdot R_4$ and $R_1 = R_2 = R_3 = R_4$. However, in the actual Hall effect element 20 having an asymmetrically etched Hall-pattern 19 as illustrated in FIG. 3, the respective resistances $R_1$, $R_2$, $R_3$, $R_4$ have different values, and this fact becomes the origin of a considerably large value of unbalanced voltage $V_o$ of this Hall effect element 20.

Now an embodiment of the present invention will be described with reference to FIGS. 5 and 6.

Figure 5:
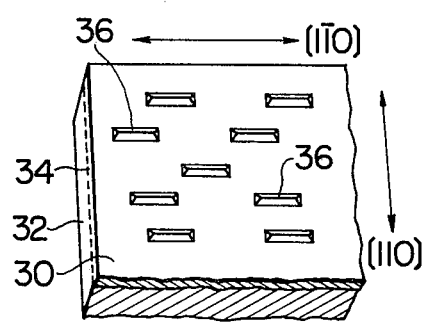
FIG. 5 is a partial and perspective view of a semiconductor single crystal wafer for the explanation of an etch-pit-pattern which gives information about the orientation of the single crystal.

FIG. 5 shows a wafer 30 for producing a GaAs Hall effect element according to the invention. This wafer 30 does not differ from the wafer 10 of FIG. 1 for conventional Hall effect elements. More in detail, this wafer 30 consists of a semi-insulating substrate 32 (not lower than $10^6$ Ωcm in specific resistance) made of a single crystal of GaAs doped with chromium and oxygen and a conducting layer 34 (not higher than 0.1 Ωcm in specific resistance) of Sn-doped GaAs formed on a surface given by a (1 0 0) plane of the GaAs single crystal 32, by an epitaxial growth technique or alternatively by an impurity diffusion technique, to have a thickness of about 2 to about 10 μm. At first, the outer surface of the conducting layer 34 is coated with a protective film (not illustrated) formed by the application of a conventional photoresist.

Crystallographic directions in the surface of the wafer 30, i.e. in the (1 0 0) plane of the GaAs single crystal, can be determined by the following procedure.

Within a limited area, the photoresist film is subjected to exposure to ultraviolet rays and subsequent development to expose the outer surface of the wafer 30 in this limited area. The thus exposed area is subjected to chemical etching by immersion in an etching solution, for example in a 2:1 mixture of HF and an aqueous solution (33 Wt%) of $CrO_3$ for 4 min at room temperature. As the result, there appears an etch-pit pattern in the exposed and etched area of the wafer surface, and this etch-pit pattern gives accurate information about crystallographic directions in the (1 0 0) plane of the GaAs single crystal. As illustrated in FIG. 5, all the etch-pits 36 are elongated in the same direction. The longitudinal direction of these etch-pits 36 coincides with the crystallographic [1 1 0] direction in the (1 0 0) plane of the GaAs single crystal 32. Naturally, the direction normal to the longitudinal direction of the elongated etch-pits 36 in the same plane is the [1 $\bar{1}$ 0] direction.

Figure 6:
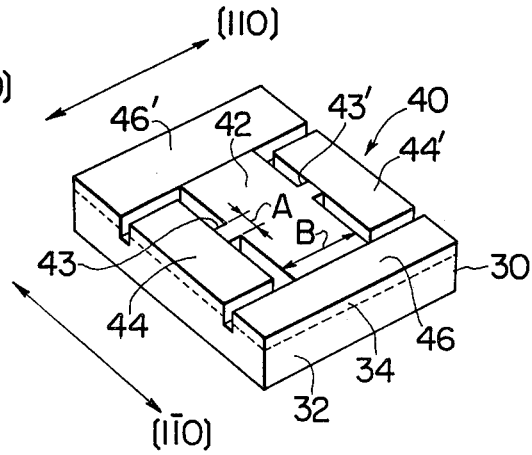
FIG. 6 is a schematic and perspective view of a Hall effect element according to the invention.

After testing procedure, a Hall effect element 40 as shown in FIG. 6 was produced by using the wafer 30 of FIG. 5. The photoresist film was selectively removed (using a patterned mask) by exposure to ultraviolet rays and subsequent development so as to provide an etching pattern corresponding to a cross-shaped Hall-pattern 42 as shown in FIG. 6 in such an orientation that the direction of current inflow in this Hall-pattern 42 substantially coincides with the [1 $\bar{1}$ 0] direction of the GaAs single crystal wafer 30 in the (1 0 0) crystal plane. In FIG. 6, numerals 44, 44' indicate output terminals of the Hall effect element 40 and numerals 46, 46' input terminals for the application of a bias current to this element 40. By way of example, the etching was accomplished by using an aqueous etching solution, which was a 1:1:1 mixture of $H_2SO_4$, $H_2O_2$ and $H_2O$, at about 60° C. for a period of 10–20 sec. As the result, the etching reached to a depth of about 5–15 μm from the initial outer surface of the conducting layer 34 (which was 2–10 μm thick), meaning that the semi-insulating GaAs substrate 32 was etched to a depth of about 3–5 μm from the surface covered with the conducting layer 34, i.e. the surface given by the (1 0 0) plane of the GaAs single crystal 32.

As the effect of substantial coincidence of the direction of current inflow in the Hall-pattern 42 with the [1 $\bar{1}$ 0] direction in the [1 0 0] plane, the laterally extending end regions 43, 43' of the Hall-pattern 42 were right-angled and had symmetry with respect to the central axis of these regions 43, 43', meaning that each of these regions 43, 43' was uniform in width (indicated by character A in FIG. 6) and had two parallel side edges. Also it was confirmed that lateral expansion of the etching pattern (scale of side-etching) was 5 μm at each side edge of the output end regions 43, 43' and 7 μm at each side edge of the remaining or longitudinally extending region (having a width B) of the Hall-pattern 42. This means that the specific orientation of the Hall-pattern 42 according to the invention offers an additional merit that the deviation of the actually etched pattern from the intended etching pattern with respect to the width A of the output end regions 43, 43' lessens and, therefore, variations in the width A in mass production can be lessened.

Owing to the right-angled and symmetrical shape of the output end regions 43, 43' of the Hall-pattern 42, there was little difference among the four resistances $R_1$, $R_2$, $R_3$, $R_4$ in the equivalent circuit of this Hall effect element 40, and hence this element 40 was very small in the magnitude of unbalanced voltage $V_o$ and excellent in performance. Besides, it was possible to produce a larger number of identical Hall effect elements 40, all very small in the magnitude of unbalanced voltage $V_o$, in a single sheet of wafer 30. When a number of Hall effect elements of the same design were produced in a single sheet of similarly prepared wafer but without paying any particular attention to the orientation of the etching pattern relative to crystallographic directions in the (1 0 0) plane of the single crystal wafer, the resultant Hall effect elements were considerably large in the magnitude of unbalanced voltage $V_o$, and considerable variations were observed among the unbalanced voltage values of this group of Hall effect elements.

As can be anticipated from the result of the above described example, an identically excellent result was obtained also when the Hall-pattern 42 was oriented such that the direction of current inflow in the Hall-pattern 42 was made to substantially coincide with the [1 1 0] direction in the (1 0 0) plane of the GaAs single crystal 32.

The present invention is not limited to a GaAs Hall effect element but is also and similarly applicable to Hall effect elements utilizing other III-V compound semiconductors exemplified by InSb and InAs.

The conducting layer 34 in the Hall effect element 40 of FIG. 6 was of n-type, but this is not limitative. The conducting layer of a Hall effect element according to the invention may be either of n-type or of p-type.

In the fabrication of a Hall effect element according to the invention, it is possible and similarly effective to form the Hall-pattern by a conventional gas etching technique such as plasma etching in place of the hereinbefore described chemical etching method using an etching solution.

What is claimed is:

1. In a Hall effect element having a substrate which is made of a single crystal of a compound semiconductor made to be semi-insulating, and has a major surface given by a (1 0 0) crystal plane of the single crystal and a conducting layer of an impurity-doped compound semiconductor formed on the major surface of the substrate, and selectively etched together with a surface region of the substrate such that the Hall effect element has a Hall-pattern which provides a pair of input end terminals respectively, at both ends of a longitudinally extending region and a pair of output terminals respectively, at both ends of a laterally extending region, the improvement comprising said Hall-pattern being formed in such an orientation that the direction of current inflow in said Hall-pattern through said input terminals substantially coincides with a predetermined crystallographic direction of said single crystal in said (1 0 0) crystal plane, said predetermined crystallographic direction being one of the $[1\ \bar{1}\ 0]$ direction and the $[1\ 1\ 0]$ direction.

2. A Hall effect element according to claim 1, wherein said compound semiconductor of said substrate and said compound semiconductor of said conducting layer are both a III-V compound semiconductor selected from the group consisting of GaAs, InSb and InAs.

3. A Hall effect element according to claim 2, wherein said conducting layer is of n-type.

4. A Hall effect element according to claim 2, wherein said conducting layer is of p-type.

* * * * *